(12) United States Patent
Yu

(10) Patent No.: US 6,238,936 B1
(45) Date of Patent: May 29, 2001

(54) METHOD OF USING CRITICAL DIMENSION MAPPING TO QUALIFY A NEW INTEGRATED CIRCUIT FABRICATION ETCH PROCESS

(75) Inventor: Warren T. Yu, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/263,065

(22) Filed: Mar. 8, 1999

(51) Int. Cl.[7] .................................................. H01L 21/00
(52) U.S. Cl. ............................. 438/7; 438/695; 438/696; 438/699; 438/703; 438/712; 438/725; 438/749
(58) Field of Search .............................. 438/7, 695, 696, 438/699, 703, 712, 725, 749

(56) References Cited

U.S. PATENT DOCUMENTS

| | | | | |
|---|---|---|---|---|
| 5,324,689 | * | 6/1994 | Yoo | 437/228 |
| 5,392,361 | | 2/1995 | Iamizumi et al. | 382/8 |
| 5,555,319 | * | 9/1996 | Tsubusaki et al. | 382/170 |
| 5,670,423 | * | 9/1997 | Yoo | 437/192 |
| 5,968,844 | * | 10/1999 | Keller | 438/695 |
| 5,994,009 | * | 11/1999 | Tzu et al. | 430/30 |

OTHER PUBLICATIONS

S. Wolf and R.N. Tauber, Silicon Processing for the VLSI Era, vol. 1—Process Technology, pp. 446–455.

* cited by examiner

Primary Examiner—Richard Elms
Assistant Examiner—Pho Luu

(57) ABSTRACT

In order to improve the quality of a semiconductor product, mapping of the critical dimensions of predetermined features such as ring oscillators, test transistors, turning forks WET transistors etc., is carried out at various stages of the manufacturing process. For example, a reticle is mapped, the etch mask which is produced from the effect of the image on the resist layer, and the results of the etching are respectively mapped. Using the data gleaned from these mappings, it is determined if any of the control variables of a new etch process require adjustment to improve the quality of the end product. Therefore, when an etch process is introduced to the process, it is possible to run the diagnostic process and then work back via the collected critical dimension data to determine what changes in the control parameters are appropriate to improve the resulting product.

6 Claims, 5 Drawing Sheets

POLY GATE CD MAP FEATURE LOCATION

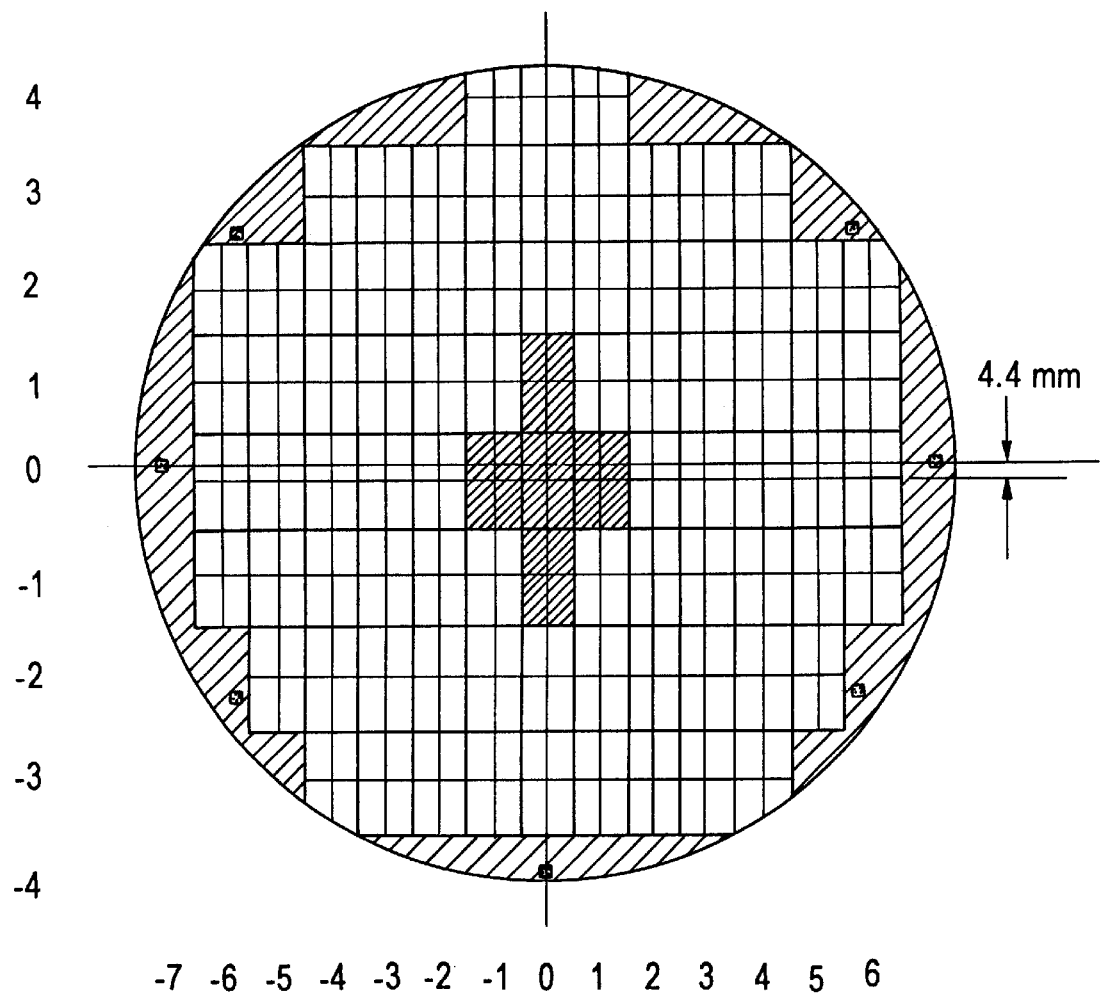

FIG. 4  CD MAP DATA SUMMARY

| TYPE | ORIEN | TARGET | STAT | K6_1 | K6_2 | K6_3 | K6_4 | MEAN | STD | RANGE |
|---|---|---|---|---|---|---|---|---|---|---|
| TR | HOR | DENSE | MEAN | 0.21274 | 0.21298 | 0.21496 | 0.21052 | 0.21280 | .0039807 | 0.0142 |
| TR | HOR | DENSE | STD | 0.00361 | 0.00514 | 0.00303 | 0.00378 | 0.21280 | .0039807 | 0.0142 |
| TR | HOR | DENSE | RANGE | 0.00810 | 0.01240 | 0.00810 | 0.00990 | 0.21280 | .0039807 | 0.0142 |
| TR | HOR | DENSO | MEAN | 0.21962 | 0.21680 | 0.21582 | 0.21038 | 0.21566 | .0053242 | 0.0166 |
| TR | HOR | DENSO | STD | 0.00549 | 0.00306 | 0.00563 | 0.00271 | 0.21566 | .0053242 | 0.0166 |
| TR | HOR | DENSO | RANGE | 0.01190 | 0.00720 | 0.01420 | 0.00590 | 0.21566 | .0053242 | 0.0166 |
| TR | HOR | ISO | MEAN | 0.21834 | 0.21326 | 0.21666 | 0.21508 | 0.21584 | .0044297 | 0.0170 |
| TR | HOR | ISO | STD | 0.00357 | 0.00532 | 0.00354 | 0.00467 | 0.21584 | .0044297 | 0.0170 |
| TR | HOR | ISO | RANGE | 0.00850 | 0.01380 | 0.00980 | 0.01180 | 0.21584 | .0044297 | 0.0170 |
| TR | VER | DENSO | MEAN | 0.21926 | 0.21058 | 0.21338 | 0.21244 | 0.21392 | .0051935 | 0.0164 |
| TR | VER | DENSO | STD | 0.00358 | 0.00277 | 0.00515 | 0.00533 | 0.21392 | .0051939 | 0.0164 |
| TR | VER | DENSO | RANGE | 0.00820 | 0.00710 | 0.01290 | 0.01400 | 0.21392 | .0051935 | 0.0164 |

| TYPE | ORIEN | TARGET | STAT | K6_1 | K6_2 | K6_3 | K6_4 | MEAN | STD | RANGE |
|---|---|---|---|---|---|---|---|---|---|---|
| RINGOS | HOR | DENSE | MEAN | 0.21318 | 0.21008 | 0.21106 | 0.21074 | 0.21127 | .0032030 | 0.0144 |
| RINGOS | HOR | DENSE | STD | 0.00233 | 0.00250 | 0.00541 | 0.00105 | 0.21127 | .0032030 | 0.0144 |
| RINGOS | HOR | DENSE | RANGE | 0.00530 | 0.00690 | 0.01440 | 0.00210 | 0.21127 | .0032030 | 0.0144 |
| RINGOS | HOR | DENSO | MEAN | 0.21158 | 0.20790 | 0.20924 | 0.20658 | 0.20883 | .0047685 | 0.0155 |
| RINGOS | HOR | DENSO | STD | 0.00518 | 0.00218 | 0.00526 | 0.00563 | 0.20883 | .0047685 | 0.0155 |
| RINGOS | HOR | DENSO | RANGE | 0.01330 | 0.00590 | 0.01180 | 0.01470 | 0.20883 | .0047685 | 0.0155 |
| RINGOS | HOR | ISO | MEAN | 0.21224 | 0.20728 | 0.20934 | 0.21076 | 0.20991 | .0048506 | 0.0145 |
| RINGOS | HOR | ISO | STD | 0.00365 | 0.00620 | 0.00541 | 0.00373 | 0.20991 | .0048506 | 0.0145 |
| RINGOS | HOR | ISO | RANGE | 0.00980 | 0.01450 | 0.01130 | 0.00980 | 0.20991 | .0048506 | 0.0145 |

| TYPE | ORIEN | TARGET | STAT | C | LL | TARGET DENSO | LR | MEANS | UL | STD | UR | RANGE |
|---|---|---|---|---|---|---|---|---|---|---|---|---|
| WET | VER | | MEAN | 0.20245 | 0.20570 | | 0.21142 | 0.21062 | 0.20808 | .0042157 | 0.20720 | 0.0106 |
| WET | VER | | STD | 0.00546 | 0.00374 | | 0.00617 | | 0.00298 | | 0.00485 | |
| WET | VER | | RANGE | 0.01560 | 0.00980 | | 0.01750 | | 0.00860 | | 0.01150 | |

| TYPE | ORIEN | TARGET | STAT | MEAN | STD | RANGE |
|---|---|---|---|---|---|---|
| TF | VER | DENSO | MEAN | 0.20697 | .0053506 | 0.0244 |
| TF | VER | DENSO | STD | 0.20697 | .0053506 | 0.0244 |
| TF | VER | DENSO | RANGE | 0.20607 | .0053506 | 0.0244 |

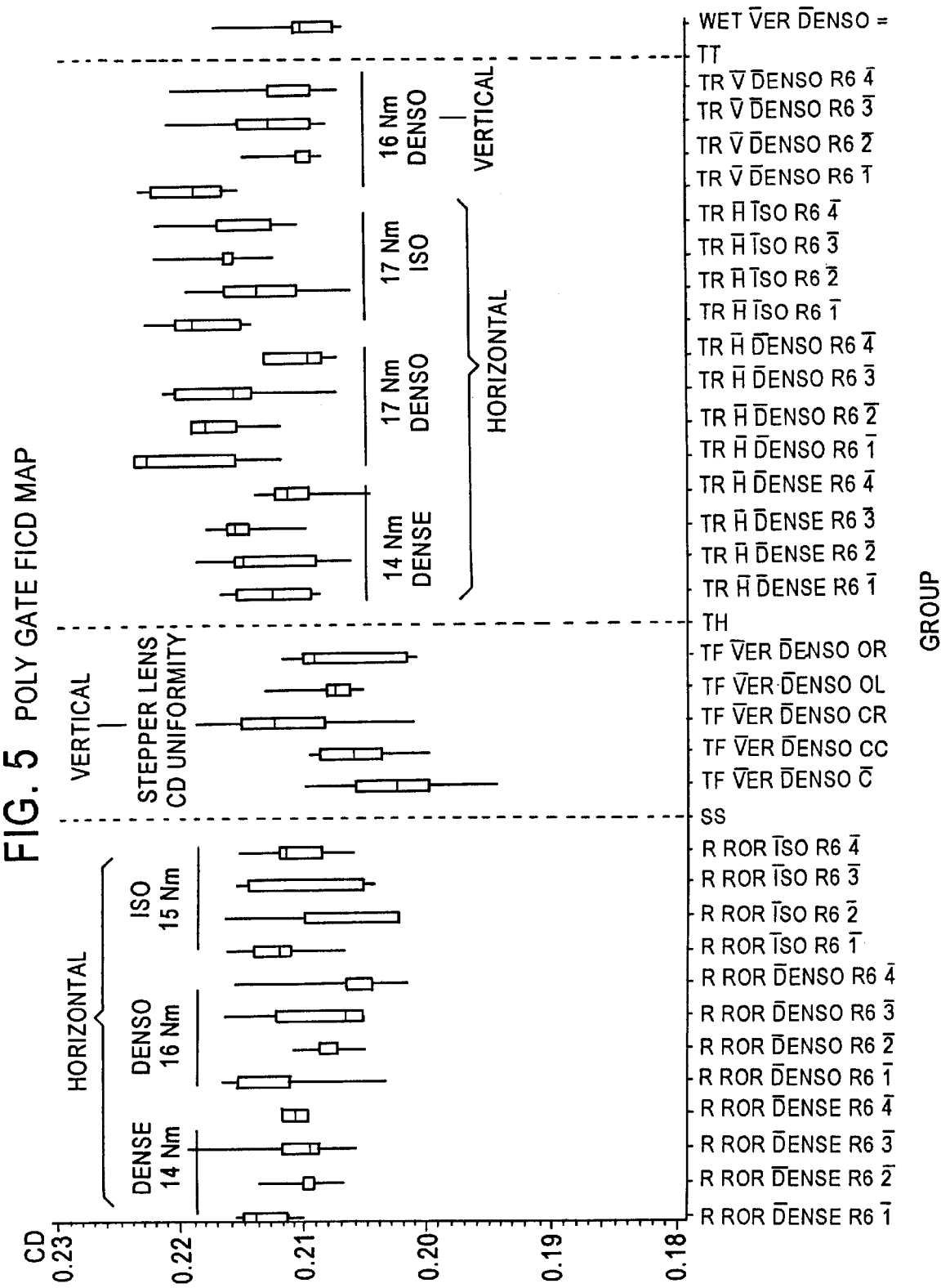
FIG. 5 POLY GATE FICD MAP

METHOD OF USING CRITICAL DIMENSION MAPPING TO QUALIFY A NEW INTEGRATED CIRCUIT FABRICATION ETCH PROCESS

BACKGROUND OF THE INVENTION

1. Field of the Invention

The present invention relates generally to techniques which are used during the fabrication of semiconductor devices. More specifically, the invention relates to a technique which uses multiple mappings of critical dimensions of selected features formed on a wafer during the process of forming integrated circuits, to enable a new etch process to be qualified in an efficient manner and with particular regard to mitigating effects which are encountered during the various steps which are carried during the constructive processes.

2. Description of the Related Art

When a new etch process is introduced, it is difficult to predict the exact results which will be achieved using the same. Accordingly, it is necessary to conduct tests which will reveal the degree to which a positive or negative bias, or other effects such as incomplete etching, overetching including undercutting and/or resist lifting etc., have on the type of etching process being used.

In the case of wet etching of silicon, it is common to use a solution of nitric and hydrofluoric acids. Depending on the ratio of the acids (viz., the recipe) the reaction can be rendered exothermic wherein the heat which is generated tends to speed up the etching process. In order to attenuate the run-away reaction being initiated it is necessary to exert some degree of control and add some modulating agent such as acetic acid or the like. A further factor influencing the process is the crystal orientation which can be used to control the shape of the bottom of a trench which is being created.

Hydrofluoric acid is widely used to etch silicon dioxide. However, in this instance also the recipe is of importance. For example, hydrofluoric acid is usually mixed with water and is buffered with ammonium fluoride to attenuate the generation of hydrogen ions which tend to accelerate the rate of etching. In the case of aluminum problems can be experienced in the event that tiny bubbles of hydrogen gas are produced. These bubbles tend to adhere to the surfaces which are being etched and caused localized slowing of the process. The lack of uniformity of material removal and/or and unexpectedly low etching degree is thus experienced.

In the case that etching of silicon nitride is required, a problem is encountered in that it is necessary to use hot phosphoric acid and, apart from the problems that handling this type of material at temperatures of about 180° C. also tends to cause thermal damage to the resist which is being used as the etch mask.

An example of wet etching which uses a combination of potassium hydroxide, ethylene glycol and water is disclosed in U.S. Pat. No. 3,909,325 issued on Sep. 30, 1975 to Church et al. This reference is hereby incorporated herein by reference.

Dry etching on the other hand. can include plasma, ion milling and reactive ion etching (RIE). As is well known, in the case of plasma etching, gases are introduced at controlled rates while the pressure in the chamber is reduced. The plasma is activated through the application of power at a selected radio frequency or frequencies. However, the effect of temperature, especially the surface temperature of the substrate being etched, must be carefully monitored along with other factors such as the flow rate of the reactants, the ion density, chamber pressure, etc. Further, the effects of plasma/radiation damage must be taken into consideration.

An example of plasma etching is given in U.S. Pat. No. 4,115,184 which was issued on Sep. 19, 1978 in the name of Poulsen. The content of this document is hereby incorporated herein by reference.

However, in the event that a new etch process is being introduced to a production line, it is necessary to taken a large number of factors into consideration depending on the type of etching and the substrate involved. Therefore, the random type of approach of determining which factors require adjustment and the direction of adjustment that is necessary tends to require an excessive amount of experimentation.

Accordingly, there exists a need for a reliable technique by which a new etch process can be introduced and qualified in a manner which identifies the problems that need to be addressed in order to achieve production set-up quickly and relatively inexpensively.

SUMMARY OF THE INVENTION

The present invention provides a technique wherein a type of feedback control can implemented in a manner that enables the calibration or qualification of a new etch process. The underlying inventive technique is based on a sequence of mappings which are carried out at each of a number of production stages, and wherein critical dimension (CD) data, accumulated during each of the mappings, are examined, compared and used to determine what adjustments can be made to ensure that the closest possible adherence to the design requirements is achieved.

The present invention, therefore, enables generation of a feedback control data base. For example, if the mapping of results of the etching are examined and it is found that a line width or corner is too great or too small, or the configurations of given features are not as good as is required to assure the best performance of the device (e.g., features necessary to optimize the speed performance of a microprocessor for example) then it is possible to determine through analysis of the data, what adjustments/changes need to be made to the etch process or processes to ensure that improvements are made and a better product is realized.

In brief, in order to improve the quality of a semiconductor product, mapping of the critical dimension of predetermined features such as ring oscillators, test transistors, turning forks wafer electrical testing-purpose (WET) transistors etc., is carried out at various stages of the process. For example, a reticle is mapped, the etch mask which is produced from the effect of the image on the resist layer, and the results of the etching is respectively mapped. Using the data gleaned from these mappings it is possible to determine from the end result, if any of the control variables of a new etch process require adjustment to improve the quality of the end product. Thus, when a etch process is introduced to the process, it is possible to run the process and then work back via the collected critical dimension data to determined what changes in the control parameters are appropriate in order to improve the fabrication result.

More specifically, a first aspect of the present invention resides in a method of qualifying an etch process which is used in connection with the fabrication of integrated circuits, the method comprising the steps of: mapping the critical dimensions of a predetermined plurality of features at each of a plurality of selected exposure fields of at a predetermined number of production stages including an etch step, of a wafer on which a plurality of integrated circuits are fabricated; comparing sets of data collected at each of the mappings; and determining, based on the comparison, what changes are required in control parameters of the etch step, to bring at least one critical dimension of at least one of the predetermined features into agreement with at least one of a predetermined set of design critical dimensions. In this method the predetermined features comprise ring oscillators, turning forks, test transistors, and wafer electrical testing-purpose (WET) transistors.

A second aspect of the present invention resides in a method of qualifying an etch process used in the production of integrated circuits, the method comprising the steps of: sequentially exposing a predetermined number of exposure fields on the wafer using a photolithic or electron beam exposure technique; developing an etch mask; mapping the etch mask to determine a first set of critical dimension data for all features that impact integrated circuit speed performance, including ring oscillators, turning forks, test transistors, and WET transistors, which are located in the exposure field, which are contained in a selected group of the predetermined number of exposure fields; etching the wafer or a substrate formed on the wafer through the etch mask, and removing the etch mask, the etch process having a plurality of control parameters; mapping the etch results to determine a second set of critical dimension data for all the features that impact integrated circuit speed performance; comparing the first and second sets of critical dimension data; and adjusting at least one of the etch process control parameters in order to bring the second critical dimension data into accordance with a prerequisite set of critical dimension values.

Another aspect of the present invention resides in a method of qualifying an etch process used in the production of integrated circuitry, the etch process having a plurality of control parameters and being carried out in a reaction chamber which is associated with a stepper, a wafer track and robotic apparatus for selectively moving a wafer between at least the stepper and the reaction chamber and for reproducibly locating the wafer in each of same, the method comprising the steps of: mapping predetermined features of a reticle to determine a first set of critical dimension data; mounting the reticle in a stepper and operating the stepper to move the substrate into a predetermined position with respect to the reticle; impressing an image produced by the reticle onto a layer of photo resist formed on the wafer a plurality of times to form a corresponding plurality of exposure fields; removing the portion of the photo resist effected by the image impression to leave a photo resist mask pattern; mapping the predetermined features as they are formed in the photo resist mask pattern for each of selected exposure fields selected from among the plurality of exposure fields, to determine a second predetermined set of critical dimension data for the pattern; etching the wafer through the photo resist mask pattern; removing the photo resist mask pattern to reveal an etched pattern formed in the wafer; mapping the predetermined features in the etched pattern corresponding to each of the selected exposure fields and recording a third set of critical dimension data; repeating the steps of impressing, removing, mapping, etching, removing and mapping, in at least one subsequent fabrication stage; comparing the first, and at least one of the second and third sets of critical dimension data with each other and/or a predetermined set of standard critical dimension data values; and determining an adjustment to at least one of etch control parameters which is required to reduce a difference between the third set of critical dimension data and the predetermined set of critical dimension data.

In this process the step of mapping comprises mapping a predetermined plurality of exposure fields which are clustered at a center portion of the wafer. The features comprise ring oscillators, turning forks, test transistors, and WET transistors.

BRIEF DESCRIPTION OF THE DRAWINGS

The various aspects and advantages of the present invention will become better understood as a description of the preferred embodiments is given with reference to the appended drawings in which:

FIG. 3 is a plan view of a wafer showing the positions of the exposure fields in which mapping according to the present invention is carried out;

FIG. 4 is a table showing the results which are graphed in FIG. 4; and

FIG. 5 is a graph showing an example of the results derived using the mapping technique.

DETAILED DESCRIPTION OF THE PREFERRED EMBODIMENTS

Figure 1:
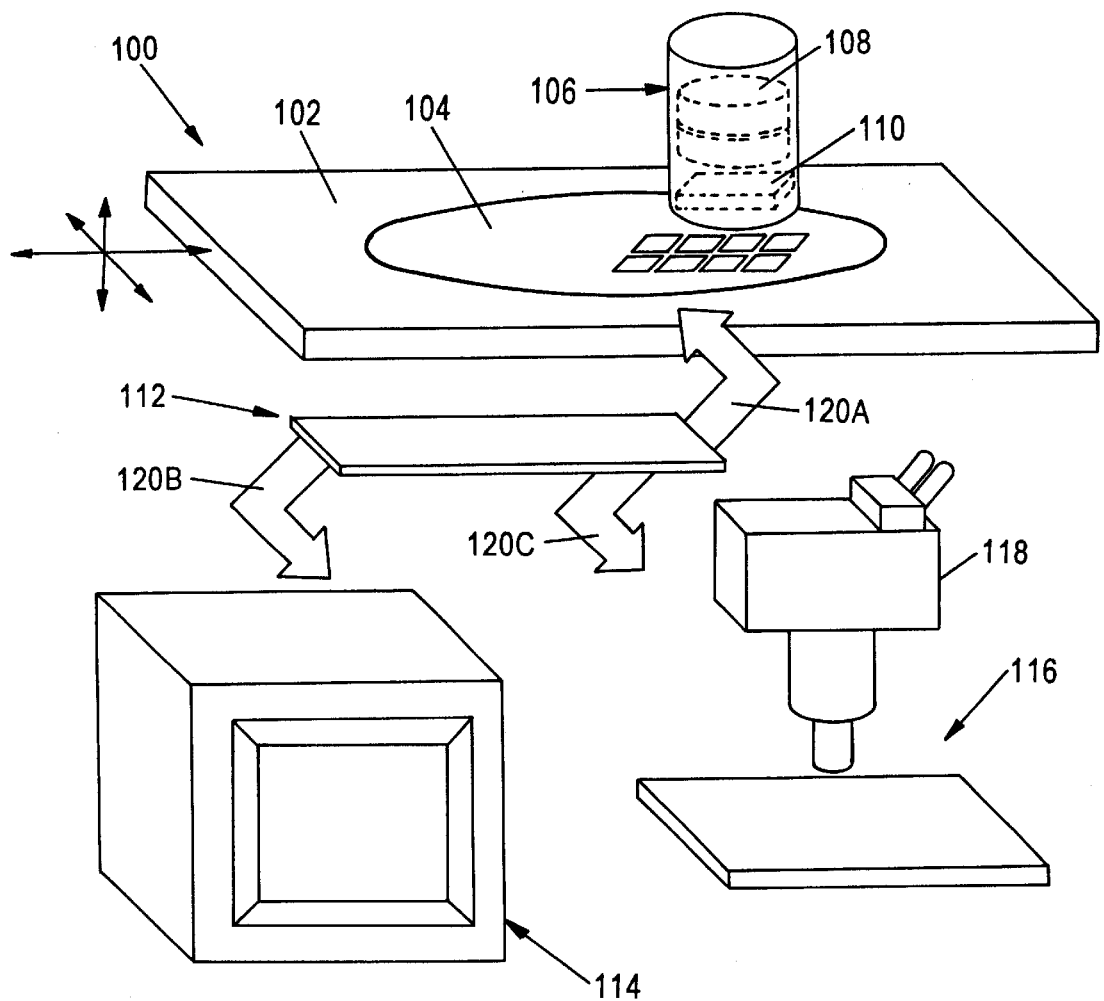
FIG. 1 is a schematic perspective view of a stepper, wafer track, reaction/process chamber, and scanning station, wherein the stepper includes an optical system in which a reticle is mounted and a moveable table on which a wafer is carried.

FIG. 1 schematically shows a stepper 100 which includes a table 102 adapted to support and hold wafers 104 thereon, and an optical system 106 which includes a source of radiant energy 108 and a reticle 110 for determining the pattern which is imprinted on the wafer. A wafer track which is use to move the wafers to and from the stepper, is denoted by the numeral 112. In this figure, the wafer track 112 is shown as being arranged to transport the wafer 104 between the stepper 100, a processing unit 114 in which etching (for example) can be carried out, and a mapping station 116 in which the features which are formed, can be measured via an electron microscope or the like device 118. Robotics which are associated with the wafer track and which are used to move the wafers from one device to another are designated by the numerals 120A, 120B and 120C. As will be appreciated, this view is highly schematic and omits all but the outlines of the basic elements of the stepper 100, wafer track 112, processing unit or chamber 114, mapping station 116 and robotics 120A–120C. Further, only a limited number of chip outlines are shown on the wafer 104 and the overall arrangement is not drawn to scale nor is intended to accurately represent the actual structures of the respective devices. For further details pertaining to the construction, control and operation of steppers reference may be had to U.S. Pat. No. 5,392,361 issued on Feb. 21, 1995 in the name of Imaizumi et al. For details pertaining to wafer tracks and associated apparatus, reference may be had to U.S. Pat. No. 5,685,588 issued to Wong et al. on Nov. 11, 1997.

In accordance with an embodiment of the present invention, before the stepper 100 is used to imprint the image which is produced by the reticle 110, repeatedly and sequentially over the surface of a resist covered wafer 104, a predetermined number of key features which are present on the reticle, are mapped and a first set of data is obtained.

Figure 2:
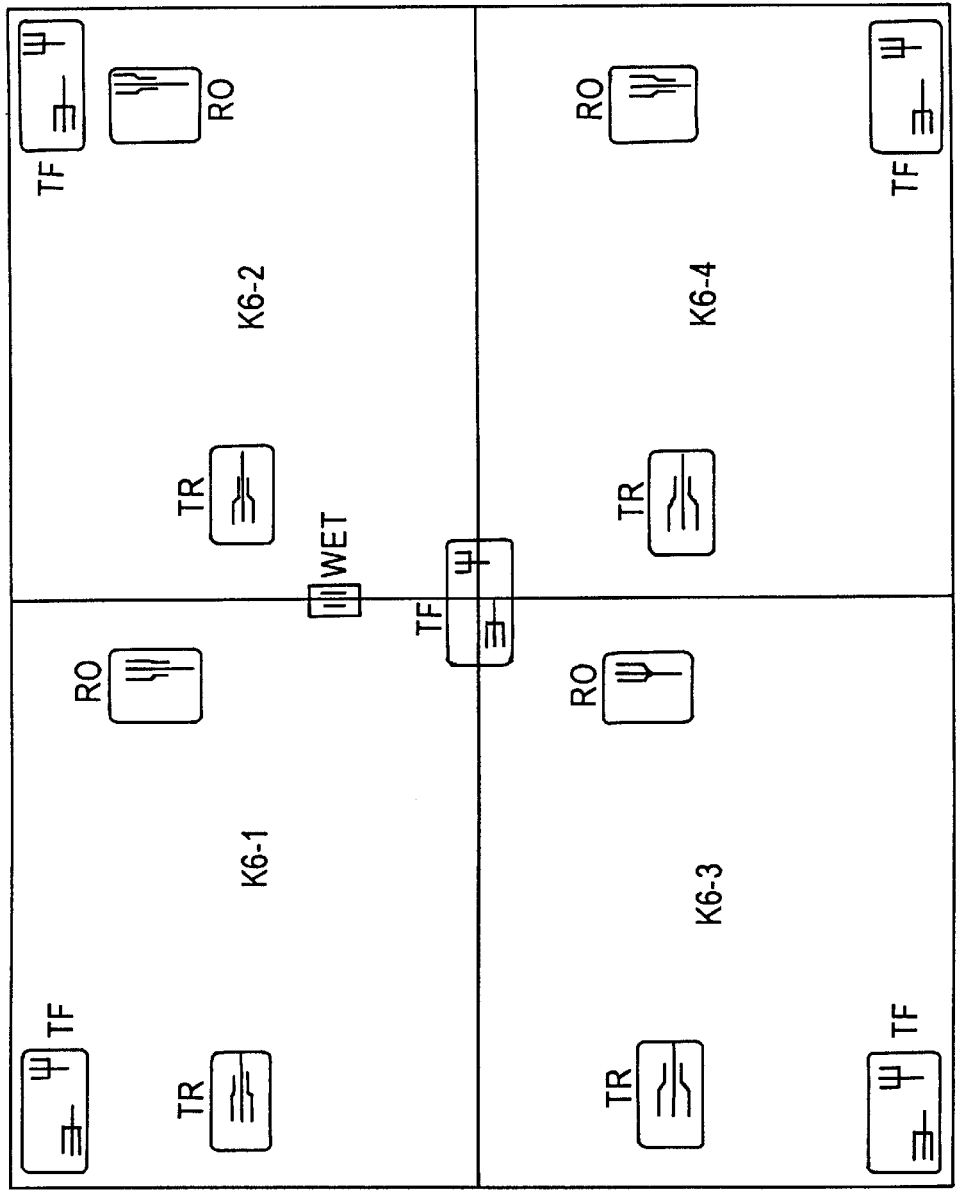
FIG. 2 is an enlarged view of an exposure field showing the features which are mapped in accordance with present invention.

FIG. 2 shows an example of the locations of the multiple features which are mapped in accordance with the present invention. As will be appreciated from this figure, a tuning fork feature TF is located at each of the four corners of the exposure field. A fifth tuning fork feature TF is formed at the center of the field at a location wherein the four quadrants K6-1, K6-2, K6-3 and K6-4 of the field, intersect with one another. Each of these features has a horizontal element and a vertical element.

In addition to the above mentioned elements, four ring oscillators RO and four test transistors TR are located in the illustrated locations. In this illustration, a single WET (Wafer Electrical Testing) transistor spans the boarder of the K6-1 and K6-2 quadrants of the exposure field. It will be understood from the following data that the test transistors, which are subjected to measurement in accordance with the present invention, have both vertical and horizontal elements which are subject to CD measurement.

Table I below clarifies the element/function relationship which exists in accordance with a preferred embodiment of the invention.

TABLE 1

Poly Gate C.D. Map Features and Functions

| | Feature | | | Function |
|---|---|---|---|---|
| (1) | Ring Oscillator Horizontal (R) | DENSE DENSO ISO | K6 1/2/3/4 K6 1/2/3/4 K6 1/2/3/4 | Directly Impacting Speed Performance and Sort Yield |
| (2) | Tuning Fork Vertical (TF) | DENSO, C (CENTER) DENSO, LL (LOWER LEFT) DENSO, LR (LOWER RIGHT) DENSO, UL (UPPER LEFT) DENSO, UR (UPPER RIGHT) | | No Electrical Value, For Measurement of Stepper Lens Field CD Control Uniformity Only |
| (3) | Test Transistor Horizontal (TR) Vertical | DENSE DENSO ISO DENSO | K6 1/2/3/4 K6 1/2/3/4 K6 1/2/3/4 K6 1/2/3/4 | Directly Impacting Speed Performance and Sort Yield |
| (4) | WET Transistor Vertical (WET) | DENSO | | For Process Electrical Evaluation Only (Electrical CDs) |

The mapping according to an embodiment of the present invention is carried out on a cluster of five center exposure fields which are shown in fine hatching at the center of the wafer 104 in FIG. 3.

FIG. 4 shows an example of the data collected using a mapping which is carried out in accordance with the present invention. FIG. 5 shows this data in graphical form.

Embodiments of the present invention include optimizing by conducting more than one mapping to determine the best effect/modification which can be made to a tool set which is being qualified or calibrated in preparation for production. That is to say, the effect of the etching step, which is carried out between the imprinting of the image on the resist layer and the final mapping which is carried out, can have a strong influence on the decision as to what modifications to operations which are ancillary to the etching process, such as the positioning operations that are carried out by the stepper (for example), which need to be made in order to rectify the process and to ensure that the CDs of the final product are as close to the design specifications as possible.

Accordingly, after the CD data for the features listed in the above table are measured via a mapping of the reticle at the mapping station 116, the reticle 110 is set in the stepper 100 and a photo resist covered wafer is sequentially imprinted to form a plurality of exposure fields. Following this, the wafer 104 is transferred to the reaction chamber 114, wherein portions of the resist layer are removed to reveal the etch mask. The wafer 104 is then removed from the chamber 114 and the CDs of the same features that were mapped on the reticle, are again mapped at the mapping station 116 and the data recorded along with that for the reticle.

The wafer 104 is then moved back along the wafer track 114 to the reaction chamber 114 wherein etching is carried out. This etching can take the form of dry etching, wet etching, plasma etching or the like. The etching mask is then removed by a well known technique such as by dissolution or by oxidation. Inasmuch as each of these process are very well known in the IC fabrication art, further explanation of this stage will be omitted for brevity.

The etched wafer 104 is then removed from the chamber 114 and transported back to the mapping station 116 and each of the features which have been previously mapped are again mapped This data is then stored.

This process of coating the upper surface of the wafer with resist, exposing surface to form a plurality of exposure fields, the removal of portions of the resist to form an etch or implantation mask, the mapping of the further features which have been formed in the mask and the subsequent etching (for example) and the mapping of the same, can be carried one or more times while collecting pertinent sets of data at each of the mappings.

The sets of data are then compared to determine if the etch process is proceeding in a manner which is satisfactory and that the final product, i.e. the etched wafer is being produced with the features in such a condition that the speed performance and the like of the device, which is being constructed using the above mentioned steps, will be as good as desired. This comparison can reveal a lot of information and provide guidance as to how to adjust the control parameters of the etch process and/or one or more stages of the process to improve the end result. However, while the resist recipe, the etch recipe/control parameters, the operation of the stepper and/or wafer track, can have a profound influence on the IC which is produced, it is the effect that the etching process which is the center of attention in this instance.

It is deemed essentially self-evident to the person skilled in the art of producing IC circuits, how the multiple mapping of the invention can be used to show how the process proceeds and what feedback adjustments need to be made to the various piece of apparatus and in particular to the control parameters of the etch process, in order to achieved the desired end. Examples of the manner in which the above type of data can be interpreted and used, is given in U.S. Pat. No. 5,646,870, issued on Jul. 8, 1997, in the name of Krivokapic et al. This reference deals with process simulation and statistical analysis of CD values. The content of this reference is hereby incorporated herein by reference thereto.

It will be further appreciated that, while only a photolithic process which utilizes visible or UV light and an reticle has been disclosed and described in the specification and drawings, it is possible that this photolithic technique can be replaced with an electron beam imprinting technique or the like, if so desired, and that the use of there other types of imprinting techniques falls within the basic purview of the invention which is limited only by the appended claims. More specifically, in the case wherein data is gathered via the mapping of poly gate CD for a specific etcher, if the collected data show the biases between iso/dense/denso features for the R (ring oscillator) and TR (test transistor) (see table 1 feature 1 and 3) are too high (i.e. >20 nm) due to etch loding effect, the etch tool is disqualified until the etch recipe and/or the stepper partial coherence adjustments are made.

Only the preferred embodiments of the present invention and but a few examples of its versatility are shown and described in the present disclosure. However, it is to be understood that the present invention is capable of use in various other combinations and environments and is capable of changes or modifications with the scope of the inventive concept expressed herein.

What is claimed is:

1. A method of qualifying an etch process which is used in connection with the fabrication of integrated circuits, the method comprising the steps of:

mapping the critical dimensions of a predetermined plurality of features at each of a plurality of selected exposure fields of at a predetermined number of production stages including an etch step, of a wafer on which a plurality of integrated circuits are fabricated;

comparing sets of data collected at each of the mappings; and determining, based on the comparison, what changes are required in control parameters of the etch step, to bring at least one critical dimension of at least one of the predetermined features into agreement with at least one of a predetermined set of design critical dimensions.

2. The method as set forth in claim 1, wherein the predetermined features comprise ring oscillators, turning forks, test transistors, and wafer electrical testing-purpose (WET) transistors.

3. A method of qualifying an etch process used in the production of integrated circuits, the method comprising the steps of:

sequentially exposing a predetermined number of exposure fields on the wafer using a photolithic or electron beam exposure technique;

developing an etch mask;

mapping the etch mask to determine a first set of critical dimension data for all features that impact integrated circuit speed performance, including ring oscillators, turning forks, test transistors, and wafer electrical testing-purpose (WET) transistors, which are located in the exposure field, which are contained in a selected group of the predetermined number of exposure fields;

etching the wafer or a substrate formed on the wafer through the etch mask, and removing the etch mask, the etch process having a plurality of control parameters;

mapping the etch results to determine a second set of critical dimension data for all the features that impact integrated circuit speed performance;

comparing the first and second sets of critical dimension data; and adjusting at least one of the etch process control parameters in order to bring the second critical dimension data into accordance with a prerequisite set of critical dimension values.

4. A method of qualifying an etch process used in the production of integrated circuitry, said etch process having a plurality of control parameters and being carried out in a reaction chamber which is associated with a stepper, a wafer track and robotic apparatus for selectively moving a wafer between at least the stepper and the reaction chamber and for reproducibly locating the wafer in each of same, the method comprising the steps of:

mapping predetermined features of a reticle to determine a first set of critical dimension data;

mounting the reticle in a stepper and operating the stepper to move the substrate into a predetermined position with respect to the reticle;

impressing an image produced by the reticle onto a layer of photo resist formed on the wafer a plurality of times to form a corresponding plurality of exposure fields;

removing the portion of the photo resist effected by the image impression to leave a photo resist mask pattern;

mapping the predetermined features as they are formed in the photo resist mask pattern for each of selected exposure fields selected from among the plurality of exposure fields, to determine a second predetermined set of critical dimension data for the pattern;

etching the wafer through the photo resist mask pattern;

removing the photo resist mask pattern to reveal an etched pattern formed in the wafer;

mapping the predetermined features in the etched pattern corresponding to each of the selected exposure fields and recording a third set of critical dimension data;

repeating the steps of impressing, removing, mapping, etching, removing and mapping, in at least one subsequent fabrication stage;

comparing the first, and at least one of the second and third sets of critical dimension data with each other and/or a predetermined set of standard critical dimension data values; and determining an adjustment to at least one of etch control parameters which is required to reduce a difference between the third set of critical dimension data and the predetermined set of critical dimension data.

5. The method as set forth in claim 4, wherein the step of mapping comprises mapping a predetermined plurality of exposure fields which are clustered at a center portion of the wafer.

6. The method as set forth in claim 4, wherein the predetermined features comprise ring oscillators, turning forks, test transistors, and wafer electrical testing-purpose (WET) transistors.

* * * * *